(12) United States Patent
Liepold et al.

(10) Patent No.: US 9,018,671 B2
(45) Date of Patent: Apr. 28, 2015

(54) CERAMIC CONVERSION ELEMENT, OPTOELECTRONIC SEMICONDUCTOR COMPONENT COMPRISING A CERAMIC CONVERSION ELEMENT, AND METHOD FOR PRODUCING A CERAMIC CONVERSION ELEMENT

(75) Inventors: Ute Liepold, München (DE); Carsten Schuh, Baldham (DE); Gia Khanh Pham, Charlotte, NC (US); Mikael Ahlstedt, München (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/350,881

(22) PCT Filed: Sep. 10, 2012

(86) PCT No.: PCT/EP2012/067665
§ 371 (c)(1),
(2), (4) Date: Jun. 25, 2014

(87) PCT Pub. No.: WO2013/056896
PCT Pub. Date: Apr. 25, 2013

(65) Prior Publication Data
US 2014/0306258 A1 Oct. 16, 2014

(30) Foreign Application Priority Data
Oct. 17, 2011 (DE) .......................... 10 2011 116 230

(51) Int. Cl.
*H01L 33/50* (2010.01)
*H01L 33/58* (2010.01)

(52) U.S. Cl.
CPC ....... *H01L 33/502* (2013.01); *Y10T 428/24355* (2015.01); *H01L 33/501* (2013.01); *H01L 33/504* (2013.01); *H01L 33/505* (2013.01); *H01L 33/58* (2013.01); *H01L 2933/0041* (2013.01); *H01L 2924/0002* (2013.01)

(58) Field of Classification Search
CPC ....................................................... H01L 33/508
USPC ....................................... 257/98, 100; 438/29
See application file for complete search history.

(56) References Cited

U.S. PATENT DOCUMENTS

| | | |
|---|---|---|
| 2007/0215890 A1 | 9/2007 | Harbers et al. |
| 2010/0038665 A1 | 2/2010 | Sugiura et al. |
| 2011/0025951 A1 | 2/2011 | Jones |

FOREIGN PATENT DOCUMENTS

| | | |
|---|---|---|
| DE | 10 2010 005 169 | 6/2011 |
| DE | 10 2010 050 832 | 5/2012 |

(Continued)

OTHER PUBLICATIONS

Written Opinion of the International Search Authority, published Apr. 17, 204 in PCT/EP2012/067665 (http://patentscope.wipo.int/search/en/detail.jsf?docId=WO2013056896&recNum=1&tab=PCTDocuments&maxRec=1&office=&prevFilter=&sortOption=Pub+Date+Desc&queryString=AN%3AEP2012%2F067665+).*

*Primary Examiner* — Thomas L Dickey
(74) *Attorney, Agent, or Firm* — DLA Piper LLP (US)

(57) ABSTRACT

A ceramic conversion element having a multiplicity of columnar regions arranged within a ceramic or vitreous matrix, wherein the columnar regions have a preferential direction which makes an angle of at most 45° with a normal to the main surface of the conversion element, at least either the columnar regions or the matrix convert electromagnetic radiation of a first wavelength range into electromagnetic radiation of a second wavelength range different from the first wavelength range and, the columnar regions are formed by wavelength-converting monocrystalline or ceramic fibers and/or monocrystalline or ceramic platelets, said fibers and/or said platelets are provided with a reflective coating.

12 Claims, 4 Drawing Sheets

(56) References Cited

FOREIGN PATENT DOCUMENTS

| | | |
|---|---|---|
| FR | 2 949 117 | 2/2011 |
| JP | 2009-140975 | 6/2009 |
| JP | 2011-23560 | 2/2011 |
| WO | 2010/134331 | 11/2010 |
| WO | 2011/030242 | 3/2011 |
| WO | 2011/079900 | 7/2011 |
| WO | 2011/092646 | 8/2011 |

* cited by examiner

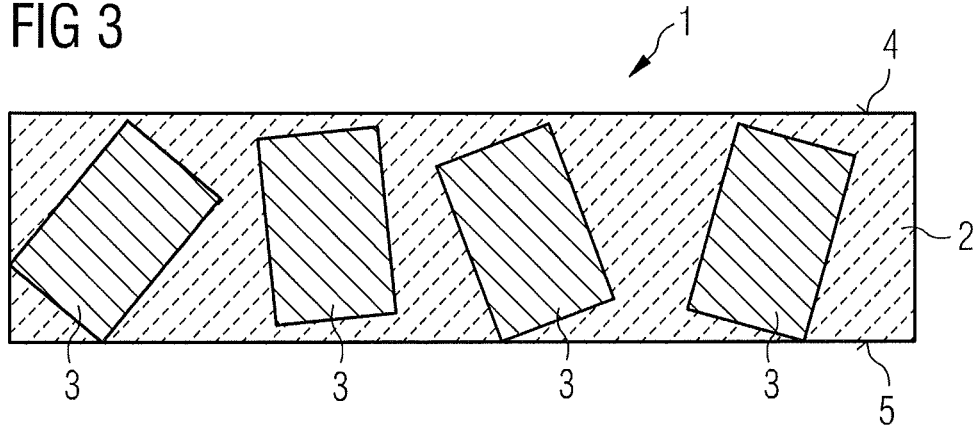
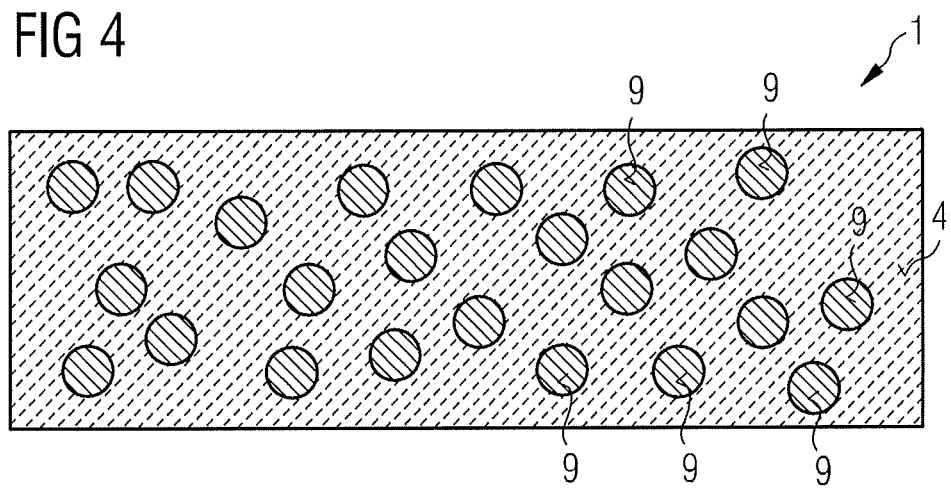
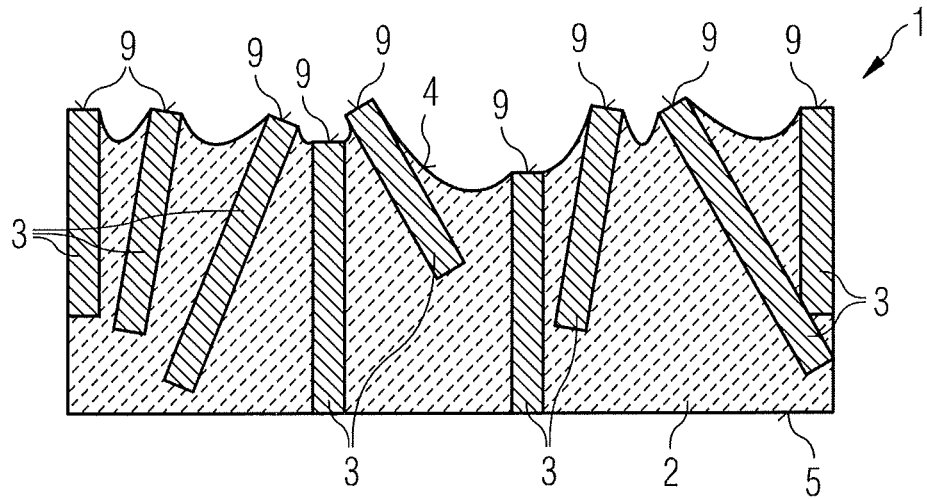

CERAMIC CONVERSION ELEMENT, OPTOELECTRONIC SEMICONDUCTOR COMPONENT COMPRISING A CERAMIC CONVERSION ELEMENT, AND METHOD FOR PRODUCING A CERAMIC CONVERSION ELEMENT

TECHNICAL FIELD

This disclosure relates to a ceramic conversion element, an optoelectronic semiconductor component having a ceramic conversion element and a method of producing a ceramic conversion element.

BACKGROUND

US 2007/0215890 discloses, for example, ceramic conversion elements whose bulk material is essentially formed homogeneously. Such conversion elements generally have the disadvantage that the color of the light emitted by them varies with the observation angle. In particular, such conversion elements generally emit light via their side surfaces so that this effect is exacerbated.

It could therefore be helpful to provide a ceramic conversion element with which the color of the emitted light is homogenized as a function of the observation angle, as well as an optoelectronic semiconductor component having such a ceramic conversion element and a method of producing such a conversion element.

SUMMARY

We provide a ceramic conversion element having a multiplicity of columnar regions arranged within a ceramic or vitreous matrix, wherein the columnar regions have a preferential direction which makes an angle of at most 45° with a normal to the main surface of the conversion element, at least either the columnar regions or the matrix convert electromagnetic radiation of a first wavelength range into electromagnetic radiation of a second wavelength range different from the first wavelength range, and the columnar regions are formed by wavelength-converting monocrystalline or ceramic fibers and/or monocrystalline or ceramic platelets, said fibers and/or said platelets are provided with a reflective coating.

We also provide an optoelectronic semiconductor component having a semiconductor body, which emits electromagnetic radiation of a first wavelength range from its radiation exit surface during operation, and a ceramic conversion element according to claim 16, arranged with its second main surface on an opposite side from the first main surface over the radiation exit surface of the semiconductor body, wherein at least a part of the radiation emitted by the semiconductor body is converted by the conversion element into radiation of a second wavelength range, which is different from the first.

We further provide a method of producing a ceramic conversion element, including providing a base material for the ceramic or vitreous matrix, introducing fibers and/or platelets into the base material so that a slip is formed, drawing the slip into a green sheet, the fibers and/or the platelets being aligned in a preferential direction parallel to a main surface of the green sheet in the direction of the drawing direction, and further processing the green sheet to form a ceramic conversion element, wherein the matrix is formed from the base material and a multiplicity of columnar regions are formed within the matrix by the fibers and/or the platelets.

We, yet further, provide a ceramic conversion element having a multiplicity of columnar regions arranged within a ceramic or vitreous matrix, wherein the columnar regions have a preferential direction which makes an angle ($\alpha$) of at most 45° with a normal to the main surface of the conversion element, and at least either the columnar regions or the matrix is suitable for converting electromagnetic radiation of a first wavelength range into electromagnetic radiation of a second wavelength range different from the first wavelength range.

BRIEF DESCRIPTION OF THE DRAWINGS

FIGS. 1 to 3 respectively show schematic sectional representations of a ceramic conversion element according to an example.

FIG. 4 shows a schematic plan view of a first main surface of a ceramic conversion element according to an example.

FIG. 5 shows another schematic sectional representation of another example of a ceramic conversion element.

DETAILED DESCRIPTION

Figure 1:
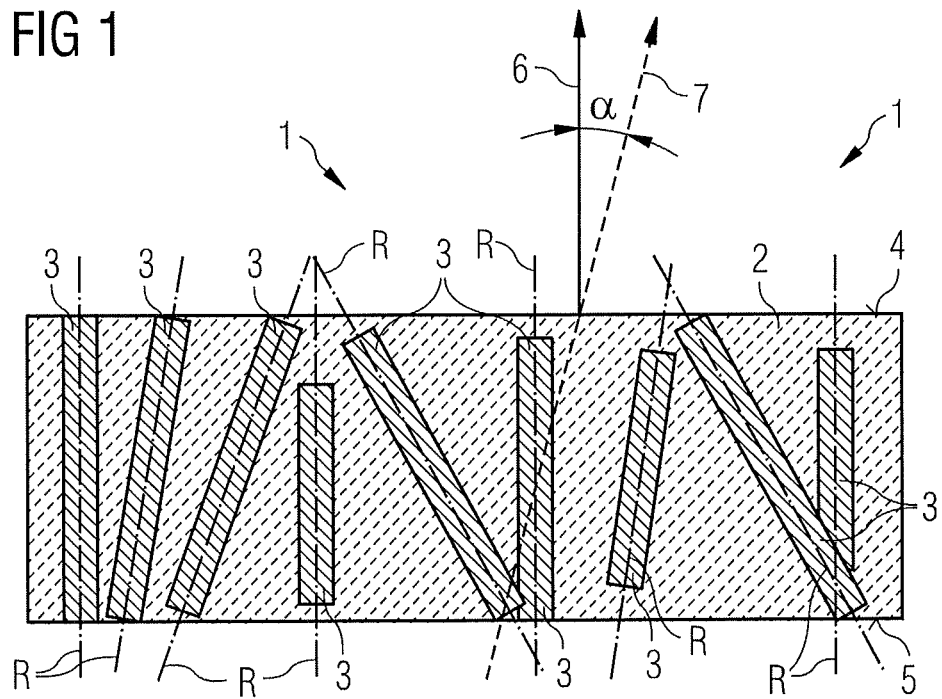

Our ceramic conversion elements preferably have a multiplicity of columnar regions arranged within a ceramic or vitreous matrix. At least in sections, the columnar regions form a cylinder. For example, the columnar regions are composed of a plurality of cylindrical sections, the rotation axes of which are arranged offset with respect to one another. In particular, it is preferably possible to assign a cylindrical envelope to a columnar region. Particularly preferably, an envelope can respectively be assigned to at least two different columnar regions, with the envelopes not intersecting.

Particularly preferably, the columnar regions have a preferential direction which makes an angle of at most 45° with a normal to the main surface of the conversion element. This means that the rotation axes of the cylindrical envelopes of the columnar regions on average make an angle of at most 45° with the normal to the main surface of the conversion element.

Particularly preferably, the preferential direction makes on average an angle of at most 30°, particularly preferably at most 20°, with the normal to the main surface of the conversion element.

Either the columnar regions or the matrix furthermore convert electromagnetic radiation of a first wavelength range into electromagnetic radiation of a second wavelength range. Furthermore, it is also possible for both the columnar regions and the matrix to be formed to convert wavelengths. Particularly preferably in this case, the matrix converts radiation of the first wavelength range into a different wavelength range from the columnar regions.

Particularly preferably, a radiation exit surface of the conversion element is formed by the first main surface or extends parallel to the first main surface.

A basic concept of the conversion element is to provide the bulk material of the conversion element with structuring which has a preferential direction that extends essentially perpendicularly to the radiation exit surface of the conversion element. Such structuring of the bulk material of the conversion element leads to an increase in the proportion of radiation reflected in the direction of the radiation exit surface when passing through the conversion element. In this way, in particular, the emission of both converted and unconverted electromagnetic radiation via the side surfaces of the conversion element can advantageously be reduced effectively.

Compared to a ceramic conversion element without structuring of the bulk material, an additional degree of freedom, with which controlled modification of the emission spectrum of the conversion element is possible, is available with the ceramic conversion element.

Particularly preferably, the columnar regions are formed from a material different from the material of the matrix. In particular, the material of the columnar regions has different optical properties, for example, a different refractive index or a different scattering cross section for electromagnetic radiation. The matrix material may also have different wavelength-converting properties compared to the material of the columnar regions.

The columnar regions may, for example, be formed to be filled with air, that is to say as pores in the matrix.

Particularly preferably, a multiplicity of the columnar regions extend fully through the conversion element from its first main surface to its second main surface. Particularly preferably, at least 10% of the columnar regions extend fully through the conversion element from its first main surface to its second main surface.

The columnar regions may be formed by wavelength-converting monocrystalline or ceramic fibers and/or monocrystalline or ceramic platelets.

Particular preferably, fibers and/or platelets which can act as a growth seed for the matrix are used to achieve a structure of the matrix textured in a controlled way.

The fibers preferably have a diameter of 1 µm to 100 µm.

Particularly preferably, the fibers have a length corresponding approximately to the product of the square root of the number two and the thickness of the conversion element. In this way, it is advantageously possible for a majority of the fibers to extend fully through the conversion element starting from the first main surface to the second main surface. Preferably, the length of the fibers is 57 µm to 424 µm. Particularly preferably, the length of the fibers is 113 µm to 212 µm.

The platelets preferably have a rectangular base shape. Particularly preferably, one side of the rectangle is formed to be longer than the other side. The thickness of the platelets are preferably 1 µm to 30 µm. At least one side edge of the platelets preferably has a length which corresponds to the thickness of the conversion element. In this way, it is advantageously possible for a majority of the platelets to extend fully through the conversion element starting from its first main surface to its second main surface.

The thickness of the conversion element is preferably 40 µm to 300 µm. Particularly preferably, the thickness of the conversion element is 80 µm to 150 µm.

Furthermore, for example, it is also possible for the matrix and the columnar regions both to be formed to convert wavelengths, and for them to differ merely in terms of the dopant concentration. The matrix and the material of the columnar regions in this case preferably have the same host lattice, into which different dopant concentrations are introduced.

The fibers and/or the platelets may be provided with a reflective coating. The coating may be formed to be specularly reflective or diffusely reflective. The specularly reflective coating is preferably formed from a high melting point noble and/or refractory metal. In particular, at least one of the following metals is suitable as a specularly reflective coating: silver, aluminum, rhodium, platinum. A diffusely reflective coating preferably comprises one of the following materials, or is formed from one of the following materials: titanium oxide, barium sulfate, silicon oxide, magnesium oxide, zirconium oxide.

The reflective coating may consist of a single layer or of a layer sequence comprising a multiplicity of individual layers, of which at least two layers differ in terms of their material.

Particularly preferably, the specularly reflective coating has a thickness of at least 100 nm. A diffusely reflective coating preferably has a thickness of at least 10 µm.

Particularly preferably, the specularly reflective coating of the fibers and/or of the platelets has a high surface quality to keep undesired scattering components low. Such a high surface quality may, for example, be produced with a sol-gel fiber drawing method.

Particularly preferably, light entry surfaces and light exit surfaces of the fibers and/or of the platelets are free of the reflective coating to ensure good transmission of the light through the fibers and/or through the platelets. In general, the end surfaces of the fibers and/or of the platelets are provided as light entry surfaces and as light exit surfaces.

The refractive index $n_1$ of the columnar regions may be different from the refractive index of the matrix. Particularly preferably, the refractive index $n_1$ of the columnar regions is greater than the refractive index $n_2$ of the matrix. Particularly preferably, the refractive index $n_1$ of the columnar regions and the refractive index $n_2$ of the matrix satisfy the condition for total internal reflection $\Phi_c = \arcsin(n_2/n_1)$ for as many angles $\Phi_c$ as possible.

In this way, in particular, total internal reflection of the radiation passing through the conversion element can be increased.

By increased total internal reflection at the interface between the matrix and the columnar regions, the radiation propagation inside the conversion element parallel to its first main surface is advantageously reduced and propagation of the radiation inside the conversion element perpendicularly to its first main surface is proportionately favored. In this way, the radiation exit from the side surfaces of the conversion element is advantageously reduced.

A very different refractive index of the matrix and of the columnar regions may, for example, be achieved by introducing ceramic fibers and/or platelets into a vitreous matrix material. Furthermore, a ceramic conversion element in which the columnar regions are formed as air-filled pores within a ceramic matrix material also has a relatively high refractive index difference between the columnar regions and the matrix material.

The fibers and/or the platelets and/or the matrix may, for example, comprise at least one of the following materials for wavelength conversion: garnets doped with rare earth metals, alkaline-earth sulfides doped with rare earth metals, thiogallates doped with rare earth metals, aluminates doped with rare earth metals, silicates doped with rare earth metals, orthosilicates doped with rare earth metals, chlorosilicates doped with rare earth metals, alkaline-earth silicon nitrides doped with rare earth metals, oxynitrides doped with rare earth metals and aluminum oxynitrides doped with rare earth metals, silicon nitrides doped with rare earth metals, sialons doped with rare earth metals.

The first main surface of the ceramic conversion element may comprise structuring according to the pattern defined by the end surfaces of the fibers and/or of the platelets. Particularly preferably, at least part of the pattern is formed periodically. With such surface structuring, it is advantageously possible to reduce reflection losses at the interface between the conversion element and the exit medium. In particular by periodic surface structuring, it is advantageously possible to positively influence the emission direction of the electromagnetic radiation. Suitable surface structuring is described, for example, in DE 10 2010 005 169, the contents of which are hereby incorporated by reference.

The ceramic conversion element is, in particular, suitable for use in an optoelectronic semiconductor component in conjunction with a radiation-emitting semiconductor body.

An optoelectronic semiconductor component comprises, for example, a semiconductor body that emits electromagnetic radiation of a first wavelength range from its radiation exit surface during operation and, furthermore, a ceramic conversion element arranged with its second main surface on the opposite side from the first main surface over the radiation exit surface of the semiconductor body. The ceramic conversion element converts at least a part of the radiation emitted by the semiconductor body into radiation of a second wavelength range different from the first.

Particularly preferably, the ceramic conversion element is applied with its second main surface in direct contact onto the radiation exit surface of the semiconductor body. In this way, in particular, improved heat dissipation from the conversion element can be achieved during operation of the optoelectronic semiconductor component. At this point, it should be pointed out that the term "the conversion element is applied in direct contact onto the radiation exit surface of the semiconductor body" also means that the conversion element is fastened on the radiation exit surface of the semiconductor body by a bonding layer.

Preferably, the semiconductor body emits electromagnetic radiation which comprises radiation from the ultraviolet, blue and/or green spectral range. Particularly preferably, the semiconductor body emits blue light.

Particularly preferably, the optoelectronic semiconductor component comprises a semiconductor body that emits blue visible light. The conversion element is in this case particularly preferably converts a part of the blue light emitted by the semiconductor body into yellow light or into green and red light so that white mixed light composed of converted radiation and unconverted radiation is formed.

If the semiconductor body emits ultraviolet light, then the ultraviolet light of the semiconductor body is preferably converted by the ceramic conversion element as fully as possible into visible light to achieve a particularly high efficiency of the semiconductor component. Particularly preferably, in this case a part of the ultraviolet radiation emitted by the semiconductor body is converted into yellow light and the remaining part of the ultraviolet radiation is converted into blue light so that the semiconductor component emits white light. Furthermore, it is also possible for the conversion element to convert one part of the ultraviolet radiation into blue light, a further part of the ultraviolet radiation into green light and the remaining part of the ultraviolet radiation into red light so that the semiconductor component likewise emits white mixed light which is composed of the converted radiation.

A ceramic conversion element may, for example, be produced by the following method:
providing a base material for the ceramic or vitreous matrix,
introducing fibers and/or platelets into the base material so that a slip is formed,
drawing the slip into a green sheet, the fibers and/or the platelets being aligned in a preferential direction parallel to a main surface of the green sheet in the direction of the drawing direction, and
processing the green sheet further to form a ceramic conversion element, the matrix being formed from the base material and a multiplicity of columnar regions being formed within the matrix by means of the fibers and/or the platelets.

In general, the green sheet is subjected to a sintering process during the further processing to form a ceramic conversion element.

In this method, a preferential direction of the fibers and/or of the platelets parallel to a main surface of the green sheet is achieved by the drawing of the slip into a green sheet. By adaptation of the volume portion of the fibers and/or of the platelets, columnar regions are formed within the matrix material. The volume proportion of fibers and/or platelets in the slip is preferably at least 10%.

During the drawing into a green sheet, a slot-die nozzle is preferably used. The opening of the slot-die nozzle preferably has a dimension of at least 150 µm, particularly preferably at least 500 µm.

The fibers and/or the platelets may be aligned by applying a magnetic field, along the magnetic field parallel to the main surface in the direction of the preferential direction of the green sheet. The magnetic field preferably has a field strength of at least 5 tesla. Particularly preferably, application of a magnetic field is carried out during drawing of the slip into a green sheet. With the aid of the magnetic field, it is advantageously possible to align the fibers and/or platelets more strongly in the direction of the preferential direction. Furthermore, the fibers and/or the platelets may also be aligned along the preferential direction by applying an electric field.

Particularly preferably, the fibers and/or the platelets are provided with a specularly or diffusely reflective coating before introduction into the base material. The coating is carried out, for example, by one of the following methods: chemical vapor deposition, wet chemical deposition, slurry fiber coating.

The fibers and/or the platelets may have different etching rates. A first main surface of the ceramic conversion element is furthermore etched such that structuring of the first main surface according to the pattern defined by the fibers and/or platelets is formed. Thus, it is possible to produce in a simple way surface structuring of the radiation exit surface of the ceramic conversion element, which advantageously increases the output of electromagnetic radiation from the conversion element.

Organic fibers and/or platelets may be used. During a subsequent sintering process, the fibers and/or platelets introduced into the base material are generally carbonized almost fully and leave behind air-filled columnar regions in the matrix material formed from the base material.

It is to be understood implicitly that examples described herein merely in connection with the conversion element may likewise be used in connection with the semiconductor component and the method. Furthermore, examples merely described in connection with the method may also be employed in the conversion element and in the semiconductor component. Likewise, examples described merely in connection with the semiconductor component may be formed in the method and the conversion element.

Other advantageous embodiments and refinements may be found in the examples described below in connection with the figures.

Elements which are the same or of the same type, or which have the same effect, are provided with the same references in the figures. The figures and the size proportions of the elements represented in the figures with respect to one another are not to be regarded as true to scale. Rather, individual elements, in particular layer thicknesses, may be represented exaggeratedly large for better representability and/or for better comprehensibility.

The ceramic conversion element 1 according to the example of FIG. 1 comprises a ceramic or vitreous matrix 2, in which a multiplicity of columnar regions 3 are incorporated. The columnar regions 3 may, for example, be formed from monocrystalline or ceramic fibers. A majority of the fibers passes through the entire thickness of the conversion element 1 from a first main surface 4 of the conversion element 1 to a second main surface 5 of the conversion element 1. The columnar regions 3 have a preferential direction 7, which makes an angle α of at most 45° with a normal 6 to the first main surface 4 of the conversion element 1. This means that the rotation axes R of the cylindrical envelopes of the columnar regions 30 on average make an angle α of at most 45° with the normal 6 to the first main surface 4.

The fibers are preferably formed to convert wavelengths, that is to say they are suitable to convert electromagnetic radiation of a first wavelength range, preferably blue light, into electromagnetic radiation of a second wavelength range, which is different to the first.

As an alternative or in addition, it is also possible for the matrix 2 to be formed to convert wavelengths, that is to say either the matrix 2 converts a further part of the radiation of the first wavelength range into radiation of a third wavelength range different from the first and second wavelength ranges, or only the matrix 2 converts at least a part of the radiation of the first wavelength range into radiation of the second wavelength range. In the case in which only the matrix 2 is formed to convert wavelengths, the columnar regions 3 may in particular be formed as air-filled pores.

As a vitreous material for the matrix 2, one of the following materials is, for example, suitable: magnesium oxide, aluminum oxide, silicon oxide, quartz glass, borosilicate glass.

Furthermore, the matrix 2 may be formed from a ceramic material.

For example, it is also possible for the matrix 2 to be formed from ceramic YAG:Ce with a first cerium concentration and for the columnar regions 3 to be formed from YAG: Ce with a second cerium concentration, the first cerium concentration being different to the second cerium concentration. The first cerium concentration and/or the second cerium concentration preferably is 0% to 6%, and particularly preferably 0% to 4%.

In the ceramic conversion element 1, preferably, the first main surface 4 is provided as the radiation exit surface and the second main surface 5, which is on the opposite side from the first main surface 4, is provided as the radiation entry surface.

Figure 2:
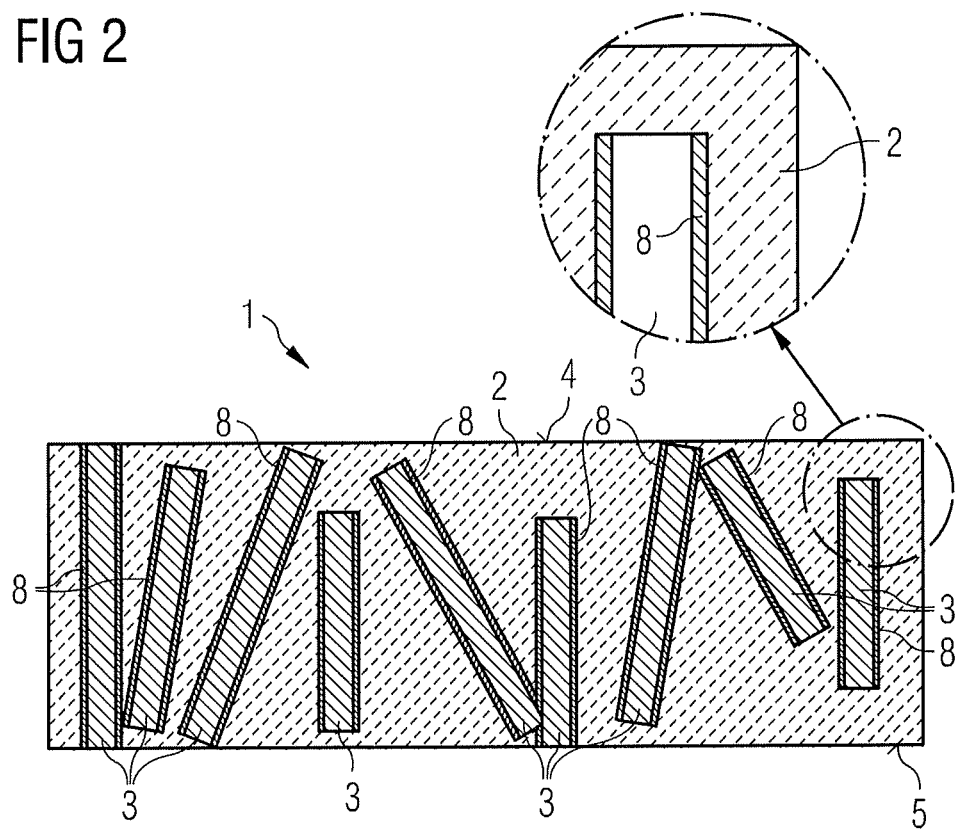

In contrast to the ceramic conversion element 1 according to the example of FIG. 1, the ceramic conversion element 1 according to the example of FIG. 2 comprises columnar regions 3 formed by coated monocrystalline or ceramic fibers. The fibers have a diffusely or specularly reflective coating 8 on their surface. A specularly reflective coating 8 is preferably formed from a high melting point noble metal and/or a refractory metal. Particularly preferably, a specularly reflective coating 8, in particular, has a high surface quality. The reflective coating 8 is provided to increase the reflection of radiation entering through the radiation entry surface at the interface between the columnar regions 3 and the surrounding matrix 2, and thus reinforce guidance of the radiation in the direction of the radiation exit surface when the radiation passes through the conversion element 1.

In the example according to FIG. 2, the reflective coating 8 is formed only on the mantel surfaces of the cylindrical fibers, while the end surfaces are respectively free of the reflective coating 8. In this way, the passage of light through the fibers is interfered with only slightly or not at all by the end surfaces.

In contrast to the ceramic conversion elements 1 of FIGS. 1 and 2, the ceramic conversion element 1 according to the example of FIG. 3 comprises ceramic or monocrystalline platelets which formed the columnar regions 3. The platelets in the present case have a rectangular base structure.

The end surfaces 9 of the columnar regions 3 of the conversion element 1 according to the example of FIG. 4, which are formed by the fibers, are arranged in a relatively regular pattern within the first main surface 4. Particularly preferably, the end surfaces 9 of the fibers in this case define an essentially periodic pattern on the first main surface 4. In the example of FIG. 4, the materials of the fibers and of the matrix 2 are selected such that they have significantly different solubilities in an acid. If the first main surface 4 is then etched, structuring according to the pattern of the end surfaces 9 of the fibers is formed during the etching of the surface. A conversion element 1 having a first main surface etched in this way is schematically shown in FIG. 5. With such surface structuring, the output from the first main surface 4, formed as a radiation exit surface, of the conversion element 1 can advantageously be increased.

The fibers may, for example, be formed from a monocrystalline or polycrystalline YAG:Ce material, while the matrix is formed, for example, from an undoped YAG material. For example, a mixture of nitric acid and hydrochloric acid, so-called "aqua regia," may be used to etch the fibers.

Figure 6:
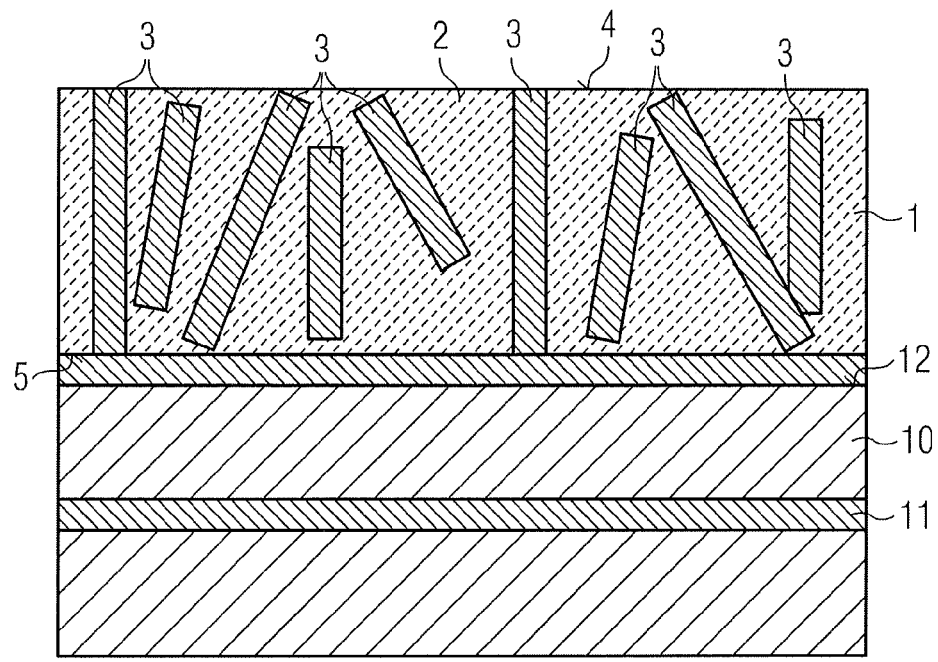
FIG. 6 shows a schematic sectional representation of a semiconductor component according to an example.

The optoelectronic component according to the example of FIG. 6 comprises a semiconductor body 10 to produce electromagnetic radiation in its active zone 11 during operation.

The active zone 11 preferably comprises a pn junction, a double heterostructure, and a single quantum well or particularly preferably a multiple quantum well (MQW) structure for the radiation generation. The term quantum well structure does not in this case involve any indication of the dimensionality of the quantization. It therefore covers inter alia quantum wells per se, quantum wires and quantum dots, and any combination of these structures.

Particularly preferably, the semiconductor body 10 emits electromagnetic radiation from the ultraviolet, blue and/or green spectral range from its radiation exit surface 12. A conversion element 1 is applied with its second main surface 5 in direct contact onto the radiation exit surface 12 of the semiconductor body 10. The direct connection between the semiconductor body 10 and the conversion element 1 is achieved in the present case by a bonding layer 13, which is applied between the conversion element 1 and the semiconductor body 10. The bonding layer 13 may, for example, comprise silicone or consist of silicone. The conversion element 1 may, for example, be formed as already described with the aid of FIGS. 1 to 5.

Particularly preferably, the conversion element 1 is provided to convert blue radiation of the semiconductor body 10 at least partially into yellow light so that the semiconductor component emits white light. The blue light generated in the active zone 11 and emitted by the radiation exit surface 12 of the semiconductor body 10 is at least partially converted into yellow radiation when passing through the ceramic conversion element 1 so that white light is emitted by the radiation exit surface 4 of the conversion element 1.

Figure 7:
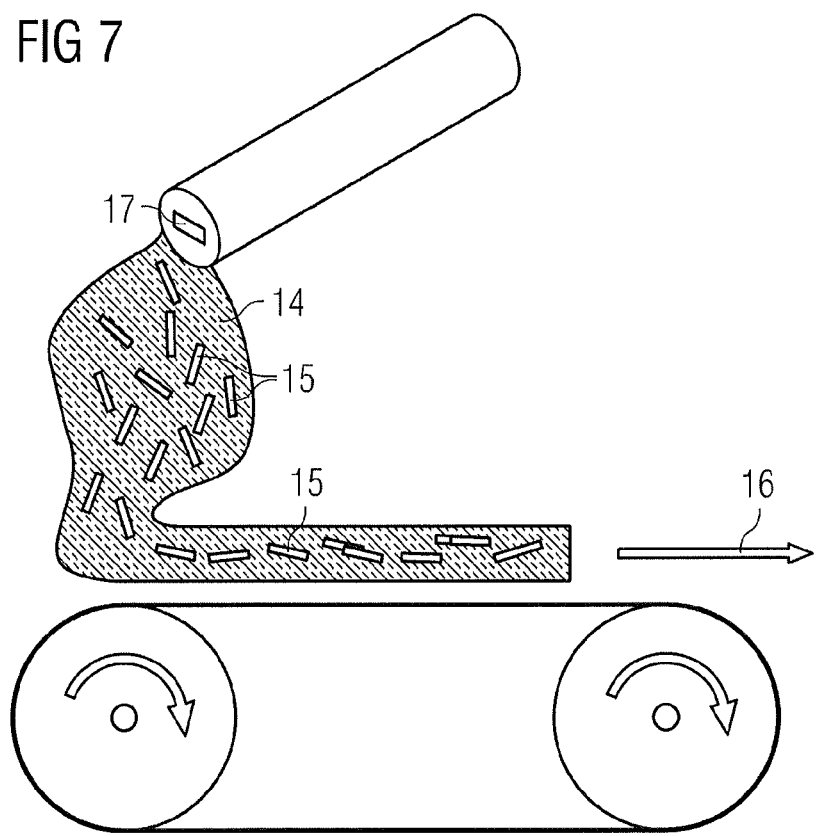
FIGS. 7 to 9 show an example of a production method for a ceramic conversion element.
Figure 8:
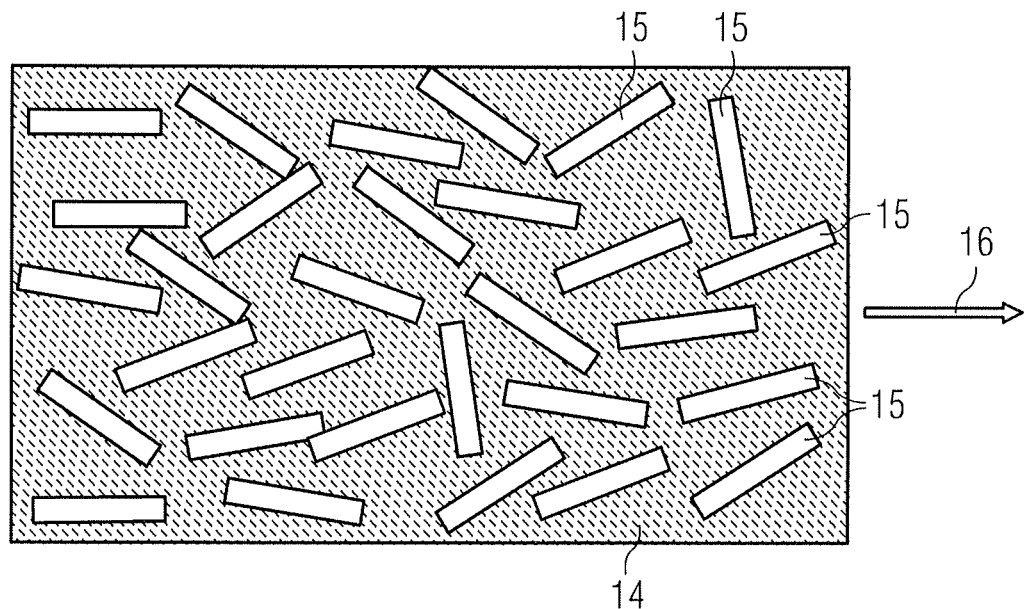

In the method according to the example of FIGS. 7 and 8, a base material 14 for the ceramic or vitreous matrix 2 is provided in a first step. Fibers 15 and/or platelets are introduced into the base material 14 so that a slip (not represented) is formed. By a next step, the slip is drawn into a green sheet, as schematically shown in FIG. 7, the fibers 15 and/or the platelets being aligned in a preferential direction parallel to a main surface of the green sheet in the direction of the drawing direction 16. This step is again represented in the plan view of FIG. 8. Preferably, a slot-die nozzle 17 is used for the drawing into a green sheet.

In a next step, the green sheet is processed further to form a ceramic conversion element 1. In this case, the matrix 2 of the conversion element 1 is formed from the base material 14 and a multiplicity of columnar regions 3 are formed within the matrix 2 by the fibers 15 and/or the platelets. In particular, the further processing of the green sheet is described in detail, for example, in DE 10 2010 005 169, the contents of which are hereby incorporated by reference.

During the further processing of the green sheet, it is generally sintered. If fibers 15 and/or platelets which are organic in nature are used, then these are generally carbonized almost fully during the sintering process and leave behind air-filled pores as columnar regions 3 within the matrix material 2.

Figure 9:
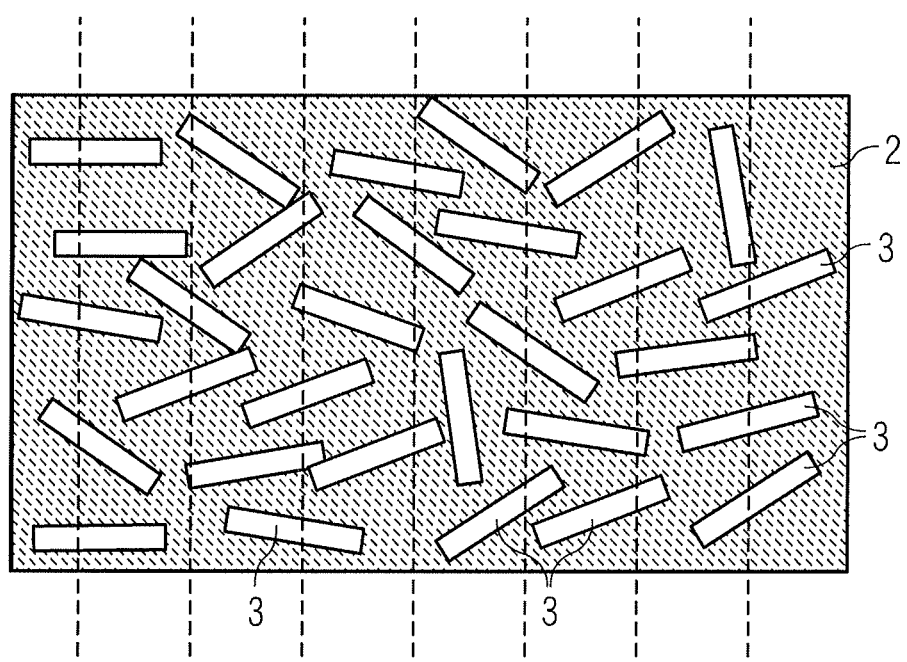

To form ceramic conversion elements 1, the resulting ceramic plate is particularly preferably divided up into conversion elements 1 perpendicularly to the main surfaces of the plate (FIG. 9).

Particularly preferably, a relatively strong magnetic field of a few tesla is applied during the drawing process, which contributes to alignment of the platelets and/or the fibers along the preferential direction 16.

By the description with the aid of examples, our elements, components and methods are not restricted to these examples. Rather, this disclosure covers any new feature and any combination of features, which includes in particular any combination of features in the appended claims, even if the feature or combination is not explicitly indicated per se in the claims or in the examples.

The invention claimed is:

1. A ceramic conversion element having a multiplicity of columnar regions arranged within a ceramic or vitreous matrix, wherein:
   the columnar regions have a preferential direction which makes an angle of at most 45° with a normal to the main surface of the conversion element,
   at least either the columnar regions or the matrix convert electromagnetic radiation of a first wavelength range into electromagnetic radiation of a second wavelength range different from the first wavelength range, and
   the columnar regions are formed by wavelength-converting monocrystalline or ceramic fibers and/or monocrystalline or ceramic platelets, said fibers and/or said platelets are provided with a reflective coating.

2. The ceramic conversion element according to claim 1, wherein:
   the matrix is formed by a wavelength-converting ceramic material having a first dopant concentration, and
   the columnar regions are formed by the wavelength-converting material having a second dopant concentration different from the first dopant concentration.

3. The ceramic conversion element according to claim 1, wherein the refractive index of the columnar regions is different from the refractive index of the matrix.

4. The ceramic conversion element according to claim 1, wherein the first main surface comprises a structuring according to the pattern defined by the end surfaces of the fibers and/or of the platelets.

5. The ceramic conversion element according to claim 4, wherein the pattern is formed to be at least partially periodic.

6. An optoelectronic semiconductor component having a semiconductor body, which emits electromagnetic radiation of a first wavelength range from its radiation exit surface during operation, and a ceramic conversion element according to claim 1, arranged with its second main surface on an opposite side from the first main surface over the radiation exit surface of the semiconductor body, wherein at least a part of the radiation emitted by the semiconductor body is converted by the conversion element into radiation of a second wavelength range, which is different from the first.

7. A method of producing a ceramic conversion element comprising:
   providing a base material for the ceramic or vitreous matrix,
   introducing fibers and/or platelets into the base material so that a slip is formed,
   drawing the slip into a green sheet, the fibers and/or the platelets being aligned in a preferential direction parallel to a main surface of the green sheet in the direction of the drawing direction, and
   further processing the green sheet to form a ceramic conversion element, wherein the matrix is formed from the base material and a multiplicity of columnar regions are formed within the matrix by the fibers and/or the platelets.

8. The method according to claim 7, wherein the fibers and/or the platelets are aligned by applying a magnetic field along a preferential direction parallel to the main surface of the green sheet.

9. The method according to claim 7, wherein the fibers and/or the platelets are formed to be ceramic or monocrystalline.

10. The method according to claim 7, wherein the fibers and/or the platelets are coated with a noble metal or a refractory metal before introduction to the base material.

11. The method according to claim 7, wherein the fibers and/or the platelets have different etching rates, and a first main surface of the ceramic conversion element is etched such that structuring of the first main surface is formed according to the pattern defined by the end surfaces of the fibers and/or platelets.

12. The method according to claim 7, wherein the fibers and/or the platelets are organic so that they leave behind air-filled columnar regions in the matrix material during the subsequent sintering of the green sheet.

* * * * *